United States Patent [19]

Stricker

[11] Patent Number: 4,723,319

[45] Date of Patent: Feb. 2, 1988

[54] SIGNAL SEEKING RADIO WITH SENSITIVITY REDUCTION RESPONSIVE TO AMBIENT LIGHT RELATED PARAMETER

[75] Inventor: Jeffrey M. Stricker, Kokomo, Ind.

[73] Assignee: General Motors Corporation, Detroit, Mich.

[21] Appl. No.: 29,059

[22] Filed: Mar. 23, 1987

Related U.S. Application Data

[63] Continuation-in-part of Ser. No. 825,341, Feb. 3, 1986, abandoned.

[51] Int. Cl.[4] ............................ H03J 7/00; H04B 1/16
[52] U.S. Cl. .................................... 455/161; 455/200; 455/345
[58] Field of Search ............... 455/161, 169, 200, 238, 455/246, 254, 345

[56] References Cited

U.S. PATENT DOCUMENTS 2,731,556  1/1956  Wiley .
2,843,734  7/1958  Lerch, Jr. et al. .
2,958,771  11/1960  Mural et al. .
4,262,363  4/1981  Wiechmann et al. ............... 455/161
4,580,285  4/1986  Richards, Jr. ........................ 455/161

FOREIGN PATENT DOCUMENTS 58-70622  4/1983  Japan ................................... 455/161

OTHER PUBLICATIONS

1978 Electronically Tuned Receiver, Delco Electronics Service Manual, pp. 12-1 thru 12-10.

Primary Examiner—Jin F. Ng
Attorney, Agent, or Firm—Robert M. Sigler

[57] ABSTRACT

A signal seeking radio receiver is disclosed in which the AGC voltage applied to the RF amplifier is automatically reduced only when a sweep tune signal is present with a signal generated by the detection of a parameter associated with low ambient light typical of nighttime operating. The night signal may be produced by an ambient light sensor or in response to the activation of a vehicle running light. Thus the stop sensitivity of the tuner in signal seeking mode is reduced at night to prevent stopping on undersirable skywave signals but is normal during daytime operation when the running light is not activated. The sweep tune signal may be the fast/slow AGC control signal or mute signal generated during signal seeking; and its removal when the sweep stops on a station provides normal AGC operation for listening, even at night. The AGC voltage is provided to the control electrode of a variable gain RF amplifier through a first impedance; and a second impedance connects the control electrode to the collector of a transistor having a base controlled by the ambient light signal and an emitter controlled by the sweep tune signal. Thus, when the night signal and sweep tune signal are simultaneously present, the transistor conducts to reduce the applied AGC voltage by the proportion of the first to the second impedance. Otherwise, full AGC voltage is applied to the control electrode of the RF amplifier.

9 Claims, 3 Drawing Figures

SIGNAL SEEKING RADIO WITH SENSITIVITY REDUCTION RESPONSIVE TO AMBIENT LIGHT RELATED PARAMETER

This application is a continuation-in-part of U.S. Ser. No. 825,341, filed Feb. 3, 1986 now abandoned, and assigned to the assignee of this application.

BACKGROUND OF THE INVENTION

This invention relates to a signal seeking radio for use on a motor vehicle and particularly to such a radio adapted for day and night operation. It is well known that RF signals in the AM broadcast frequency band tend to carry much farther at night due to reflections in the ionosphere. However, this can be a nuisance in the operation of a scanning or signal seeking radio on a motor vehicle. In the signal seeking operation, the radio tuner sweeps through a range of frequencies until a signal of a predetermined signal strength is detected. In the daytime, this corresponds to a clearly listenable station. However, at night, this may be a reflected skywave signal which is garbled and unintelligible due to changes in sideband symmetry, notching of the carrier or excessive co-channel and adjacent channel signals. Even good signals may be reflected from a distant station and be subject to degradation or complete disappearance as the vehicle changes position or direction or as atmospheric conditions change over time. Some prior art radios have been equipped with stop sensitivity switches, which allow the operator to choose between more or less sensitivity in the signal seeking operation. However, such switches must be manually operated, which is inconvenient and takes attention away from driving. It has further been suggested that a signal seeking radio start sweeping with the lowest sensitivity the first time across the frequency band and automatically switch to higher sensitivity with succeeding passes. However, this method of signal seeking operation is complicated and not easily understood by the vehicle operator.

It has further been suggested that the stop sensitivity of a signal seeking radio may be controlled by a timer to be decreased during those hours expected to produce night listening conditions. However, since sunrise and sunset vary over the course of the year and since some areas of the United States do and some do not go on daylight saving time for a portion of each year, such control is not adequate, by itself, to produce optimum operation in the twilight and/or sunrise times typical of, for example, commuting to and from work. It would be desirable to have a signal seeking radio with stop sensitivity automatically controlled in response to day-night condition.

SUMMARY OF THE INVENTION

The radio receiver of the invention is a signal seeking receiver of the type having AGC voltage generating means, a variable gain RF amplifier normally responsive to the AGC voltage to provide a normal RF gain, sweep tuning means effective when initiated to sweep tune the receiver through a broadcast frequency range and generate a sweep signal and means effective to detect a receivable broadcast signal by comparing a signal dependent upon the strength of the output of the variable gain RF amplifier with a fixed reference and both stop the tuning means thereon and end the sweep signal. The radio receiver further includes stop sensitivity control means comprising circuit means connected between the AGC voltage generating means and the variable gain RF amplifier and effective when activated to modify the AGC voltage provided to the variable gain amplifier to provide a reduced gain therein, means responsive to an ambient light related parameter to generate a night signal when said parameter has a value associated with nighttime ambient light conditions and a day signal when said parameter has a value associated with daytime ambient light conditions and logic means responsive only to the sweep signal with the night signal to activate the circuit means and thereby reduce the stop sensitivity of the sweep tuning means and otherwise to deactivate the circuit means and thus provide normal gain in the variable gain amplifier stage for broadcast reception.

The ambient light related parameter may, in one case, be outside ambient light itself, with an ambient light sensor sensitive to low ambient light intensity outside the vehicle to generate the night signal.

In another case, the ambient light related parameter may be an electrical parameter of a vehicle running light such as a parking light, with the voltage associated with said light being activated providing the night signal. Since the vehicle operator generally switches on his lights only when it is sufficiently dark to require them, and this corresponds to the time of day when less stopping sensitivity is required in signal seeking operation, the desirable sensitivity reduction is achieved automatically at the correct time. A defeat switch may be included for those times when it is desirable to have the vehicle running light on during the day. Further details and advantages will be apparent from the accompanying drawings and following description of a preferred embodiment.

DESCRIPTION OF THE PREFERRED EMBODIMENT

Figure 1:
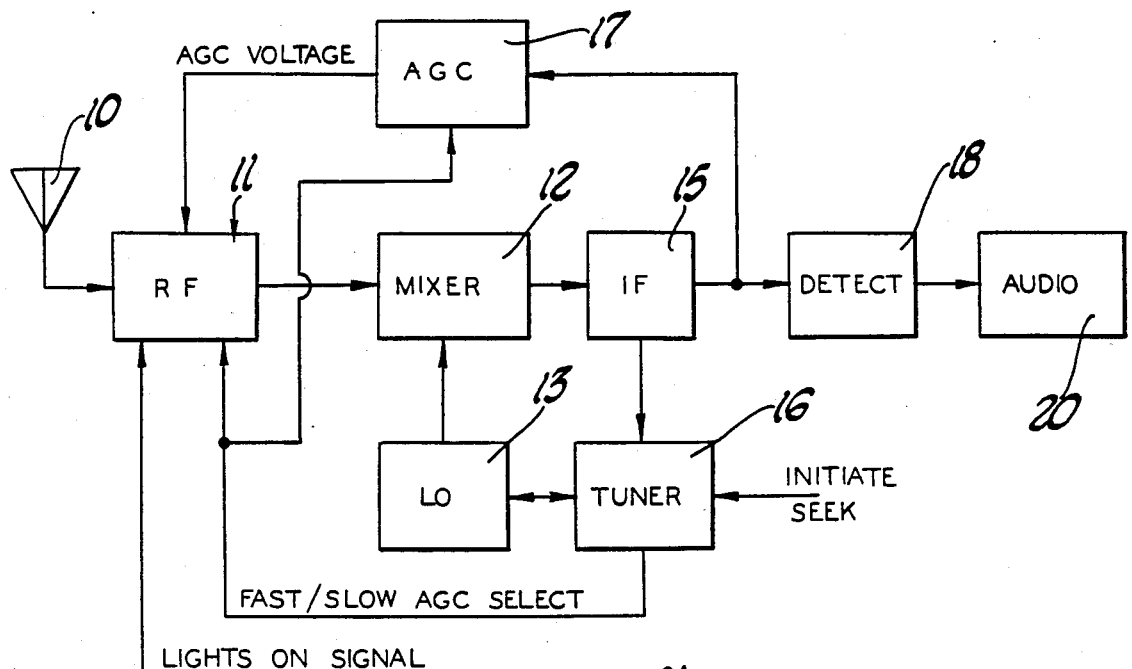
FIG. 1 shows a block diagram of a radio receiver according to the invention.

Referring to FIG. 1, a vehicle radio receiver includes an antenna 10 of any standard type, which provides an RF signal to an RF stage 11, which includes an RF amplifier of variable gain and control inputs from several sources to be described below. The output of RF stage 11 is provided to a mixer 12, wherein it is mixed with a signal from a local oscillator 13; and the signal on an RF frequency different from the local oscillator frequency by the intermediate frequency of 450 KHz is provided to the IF section 15 at the IF frequency. The IF section includes a series of narrow band filters at 450 kHz alternating with IF amplifiers optimized for amplification at that frequency. The output of IF section 15 or one of the stages therein is provided to an AGC voltage generating circuit 17, which provides an AGC voltage to the variable gain RF amplifier in RF stage 11. The output of IF section 15 is detected in detector 18; and the resulting AF signal is amplified for speaker driving in audio section 20.

A tuner 16 includes means to vary the frequency of local oscillator 13 in a known manner. For example, local oscillator 13 may be a voltage controlled oscillator; and tuner 16 may include phase lock loop control elements to control the frequency of oscillator 13 in closed loop feedback control. Tuner 16 may additionally include programming means to select the controlled frequency and to sweep the controlled frequency through a range of frequencies when provided with an "initiate seek" signal by the radio operator. IF section 15 also contains a signal strength determining apparatus which senses the presence of a station and, in turn, signals tuner 16 to stop the sweep. Tuner 16 further includes apparatus to select fast or slow AGC and sent a fast/slow AGC signal or mute signal to the AGC voltage generating circuit 17. This signal generally has a first value during sweep and a second value at other times; its purpose is to allow the AGC circuit to recover quickly during sweep operation as the tuner leaves a strong signal so that the sweep does not stop on the first available channel off station and sometimes also to provide mute during the sweep. Such tuners are well known in the art. However, this invention also provides the fast/slow AGC select signal to RF section 11 in a manner to be described below with reference to FIG. 2.

Still referring to FIG. 1, the vehicle further includes a running light 21 such as a parking light, which is connected through a switch 22 to a source of DC electrical power such as battery 23. Light 21 could alternatively be a headlamp, taillamp or other light controlled from the headlamp switch assembly. Switch 22 represents the parking light portion of a standard vehicle headlamp switch; but it could be any other part of the headlamp switch, depending on the light chosen. Battery 23 represents the standard vehicle battery and alternator electrical supply system. The ungrounded junction 25 of light 21 and switch 22 is, in this invention, tapped to provide a light on signal to RF section 11 in a manner to be described below.

Figure 2:
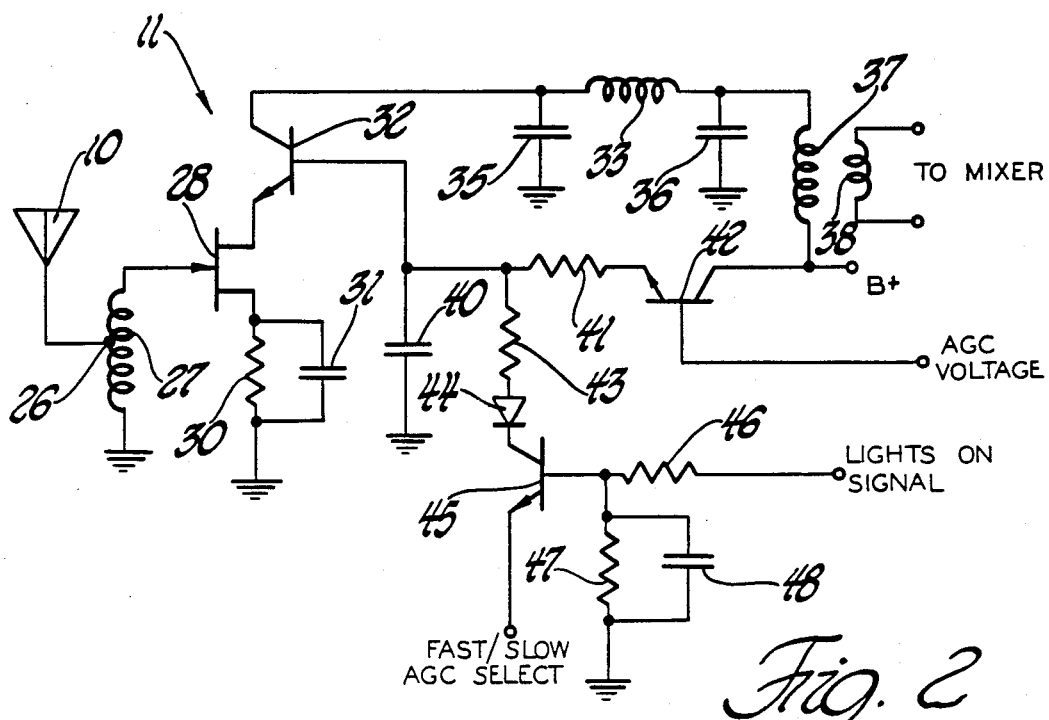
FIG. 2 shows a circuit diagram of a first embodiment of a portion of the receiver shown in FIG. 1.

Referring to FIG. 2, RF section 11 is shown in circuit diagram form. The received RF signal from antenna 10 is applied to a tap 26 of a coil 27 connected between ground and the gate of an FET 28. FET 28 has a source connected through a parallel resistor 30 and capacitor 31 to ground and a drain connected to the emitter of a bipolar NPN transistor 32. The collector of transistor 32 is connected through a low pass pi filter, comprising a series inductor 33 and shunt capacitors 35 and 36 to ground, and the primary coil 37 of a transformer to the B+ supply, which is a regulated DC supply at 8 volts derived from battery 23. Output coil 38 of the transformer is coupled to coil 37 to provide the signal to mixer 12. FET 28 and transistor 32 comprise a solid state amplifying element for the RF signal introduced on the gate of FET 28, the element having a gain controlled by a voltage signal on a control electrode comprising the base of transistor 32.

The base of transistor 32 is connected through a capacitor 40 to ground and through an impedance or resistor 41 (22 K) to the emitter of a bipolar NPN transistor 42. Transistor 42 has a collector connected to the B+ supply and a base adapted to receive the AGC voltage signal from AGC signal generating circuit 17. The AGC voltage on the base of transistor 42 controls the gain of transistor 32 and thus the gain of RF section 11 in a conventional manner. In signal seeking operation, a signal of a predetermined strength passes through RF section 11 and IF section 15 to the signal strength determining apparatus in IF section 15, which signals tuner 16 to stop its sweep. Thus, the stop sensitivity of the system depends in part on the application of the AGC voltage to transistor 32. In the prior art, this fact has been used to provide stop sensitivity control by an operator controlled switch.

The base of transistor 32 is connected through an impedance or resistor 43 (6.8 K) and a series diode 44 to the first main current carrying electrode or collector of a bipolar NPN transistor 45 having a second main current carrying electrode or emitter connected to the fast/slow AGC control line. The control electrode or base of transistor 45 is connected through a resistor 46 (22 K) to junction 25 to receive the light on signal and further through a parallel resistor 47 (4.7 K) and capacitor 48 (1 μF) to ground. Transistor 45 and its associated elements thus comprise logic means simulating an AND gate effective to provide a stop sensitivity reducing signal only when the voltages on the base and emitter thereof indicate running light on and sweep operation.

In operation at night, the switch 22 will be closed to power light 21; and a high voltage signal will be provided through the voltage divider comprising resistors 46 and 47 to the base of transistor 45. During signal seeking operation of tuner 16, the fast/slow AGC control line is pulled low by the programming control in tuner 16, as in present systems. However, in this circuit, this low voltage is applied to the emitter of transistor 45, which is biased into a conducting condition. Thus the AGC voltage at the emitter of transistor 42, rather than being applied directly to the base of transistor 32, is applied through a voltage divider comprising resistors 41 and 43. This reduces the applied AGC voltage and thus the current through FET 28. Thus a stronger received RF signal is required to stop a signal seeking sweep; and the stop sensitivity is reduced. As soon as the sweep is stopped on a station, however, the fast/slow AGC select line is sent high by tuner 16, transistor 45 is turned off and normal RF gain is restored for listening. In addition, during daytime operation when switch 22 is open, the base of transistor 45 will be connected to ground through resistors 46 and 47 in parallel; and the grounding of the emitter of this transistor by the fast/slow AGC control line when signal seeking is initiated will not cause transistor 45 to turn on. The receiver will thus operate with normal stop sensitivity.

Diode 44 is connected to prevent reverse conduction of transistor 45 when a high voltage is present on its base and emitter and a low voltage is present at the base of transistor 32. These conditions might occur when the parking lamps are on and the receiver is not in seek mode. A reverse conduction of transistor 45 under these conditions would lead to distortion in the received signal.

Variations and equivalent circuits will occur to those skilled in the art. For example, although it is not shown, it is clear that an additional switch could be provided between junction 25 and resistor 46, which could be opened to defeat the stop sensitivity reducing operation in case the vehicle operator wished to operate normally in the daytime with his lights on.

Figure 3:
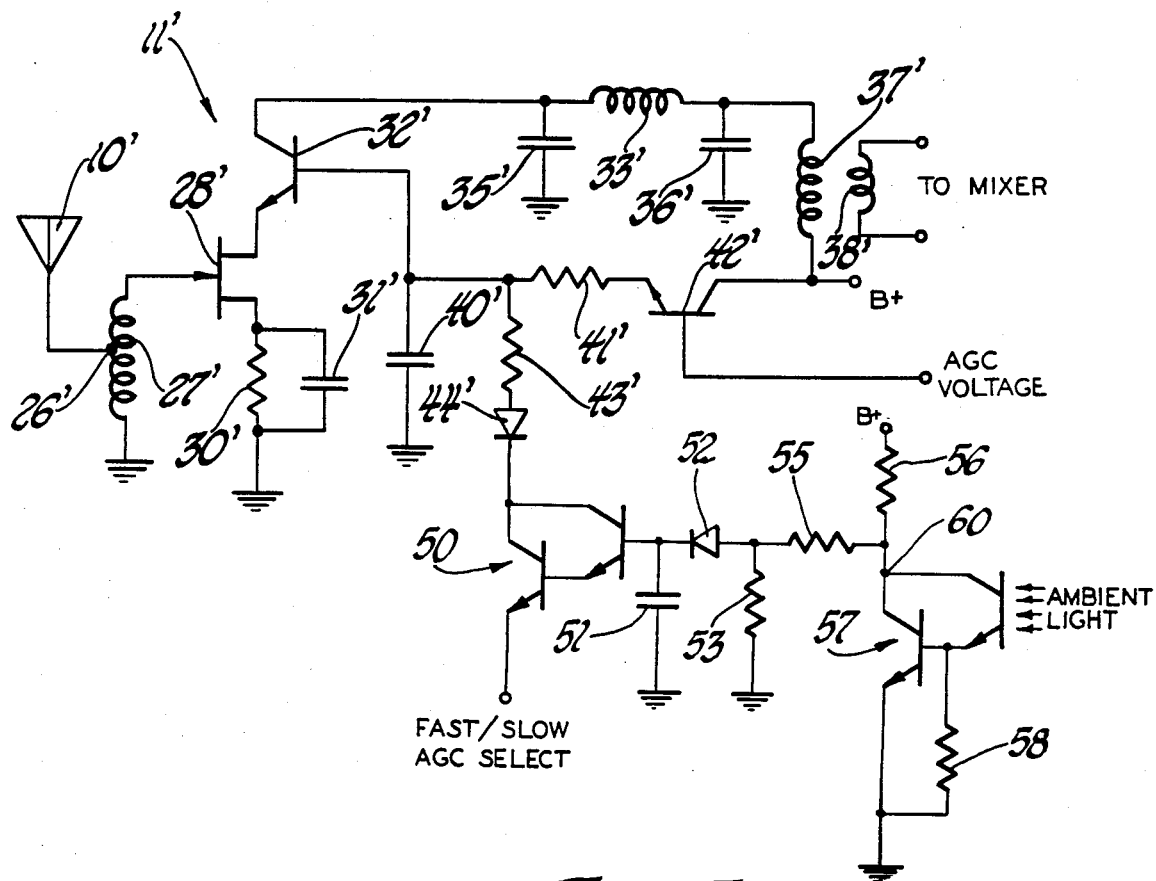
FIG. 3 shows a circuit diagram of a second embodiment of a portion of the receiver shown in FIG. 1.

Another embodiment is shown in FIG. 3, a substantial portion of which is similar to FIG. 2 and in which similar elements are correspondingly numbered with primed reference numbers. The different portion of the circuit is that connected to the cathode of diode 44'. This cathode is connected through a Darlington transistor 50 to the fast/slow AGC select line, transistor 50 having a base connected through a capacitor 51 (10 μF) to ground and to the cathode of a diode 52. The anode of diode 52 is connected through a resistor 53 (56 K) to ground and through a resistor 55 (1 K) and a resistor 56 (4.7 K) in series to power supply B+, typically at 8 volts. Junction 60 of resistors 55 and 56 is connected to the collector of a Darlington phototransistor 57 having a grounded emitter.

In operation, the conduction of phototransistor 57 varies with the intensity of ambient light to which it is exposed. It is exposed to ambient light outside the vehicle in such a way that it does not ordinarily receive direct light from the headlights of other vehicles. In darkness, there is little conduction through phototransistor 57; and conduction increases with ambient light. When it is dark and conduction is small, the voltage at junction 60 is sufficiently high that, when the fast/slow AGC select line is brought low during signal seeking, transistor 50 conducts. The remainder of the circuit operates similarly to that of FIG. 2 with transistor 45 conducting: the AGC voltage applied to transistor 32' is lowered for decreased RF gain; and stop sensitivity is reduced. As the ambient light level is increased, the voltage at junction 60 will be reduced; and a reference level will be reached at which transistor 50 is no longer turned on with its emitter brought low. Under this higher ambient light, the stop sensitivity of signal seeking operation will not be decreased.

A low pass filter including capacitor 51 and diode 52 keeps transistor 50 from automatically following transient ambient light changes, so that the stability of the circuit is improved. In particular, under nighttime conditions, transistor 50 is normally turned on; and capacitor 51 is charged up to a certain voltage. If the vehicle passes under a streetlight or is otherwise exposed to strong light, diode 52 prevents capacitor 51 from discharging quickly through resistor 53. Capacitor 51 discharges slowly through the base of transistor 50. A Darlington transistor was intentionally chosen for transistor 50 to keep the required capacitance of capacitor 51 low, since Darlingtons draw smaller base currents than ordinary transistors for equivalent collector currents. With the values indicated, the system will stay in the nighttime mode for a full minute in the presence of strong transient light. This is sufficient for typical night driving. A switch could be provided for manual override in case the vehicle was parked under a light, such as in a parking lot, for an extended time. Of course, when the transient light condition has passed, diode 52 allows quick recharge of capacitor 51. Diode 44' prevents reverse conduction of transistor 50 during normal radio listening with the fast/slow AGC select line high and bias applied to the base of transistor 50.

The embodiments of the invention in which an exclusive property or privilege is claimed are defined as follows:

1. A signal seeking radio receiver for a motor vehicle, the receiver having AGC voltage generating means, a variable gain RF amplifier normally responsive to the AGC voltage to provide a normal RF gain, sweep tuning means effective when initiated to sweep tune the receiver through a broadcast frequency range and generate a sweep signal, means effective to detect a receivable broadcast signal by comparing a signal dependent upon the strength of the output of the variable gain RF amplifier with a fixed reference and both stop the tuning means thereon and end the sweep signal, and circuit means connected between the AGC voltage generating means and the variable gain RF amplifier and effective when activated to modify the AGC voltage provided to the variable gain amplifier to provide a reduced gain therein, the circuit means further comprising, in combination:

means responsive to an ambient light related parameter to generate a night signal when said parameter has a value associated with nighttime ambient light conditions and a day signal when said parameter has a value associated with daytime ambient light conditions; and logic means responsive only to the sweep signal with the night signal to activate the circuit means and thereby reduce the stop sensitivity of the sweep tuning means and otherwise to deactivate the circuit means and thus provide normal gain in the variable gain amplifier stage for broadcast reception.

2. The radio receiver of claim 1 in which the radio receiver is adapted for a motor vehicle having a DC power source, a running light and a light switch effective to control the activation of the running light by the DC power source and the means responsive to an ambient light related parameter is responsive to an electrical parameter associated with the running light such that the night signal is generated when the light is activated.

3. The radio receiver of claim 1 in which the means responsive to an ambient light related parameter comprises a light sensitive element exposed to ambient light outside the vehicle to generate the night signal when said ambient light as sensed by the light sensitive element is lower than a predetermined intensity.

4. The radio receiver of claim 3 in which:
the light sensitive element comprises a current source at a voltage varying inversely with ambient light;
the logic means further comprises a Darlington transistor having a base and an emitter-collector current path connected to activate the circuit means when conducting; and
the means responsive to an ambient light related parameter further comprises charge storage means connected to the base of the Darlington transistor and a diode connecting the base of the Darlington transistor to the current source so as to allow current flow therefrom to the base of the Darlington transistor but prevent discharge of the charge storage means except through the base of the Darlington transistor, whereby the stop sensitivity of the radio is not increased at night during short transient ambient light increases.

5. The radio receiver of claim 1 in which the variable gain RF amplifier includes a solid state amplifying element with a control electrode providing gain control with the voltage thereon and a first impedance connecting the control electrode to the AGC voltage generating means and the circuit means includes a second impedance connected to the control electrode and solid state switch means responsive to the logic means to reduce the stop sensitivity of the sweep tuning means by activating a current path with the first and second impedances in series to reduce the proportion of the AGC voltage applied to the control electrode of the solid state amplifying element.

6. The radio receiver of claim 5 in which the radio receiver is adapted for a motor vehicle having a DC power source, a running light and a light switch effective to control the activation of the running light by the DC power source and the means responsive to an ambient light related parameter is responsive to an electrical parameter associated with the running light such that the night signal is generated when the light is activated.

7. The radio receiver of claim 5 in which the means responsive to an ambient light related parameter is a light sensitive element exposed to ambient light outside the vehicle to generate the night signal when said ambient light as sensed by the light sensitive element is lower than a predetermined intensity.

8. The radio receiver of claim 7 in which:
the light sensitive element comprises a current source at a voltage varying inversely with ambient light;
the solid state switch means further comprises a Darlington transistor having a base and an emitter-collector current path connected to activate the circuit means when conducting; and
the means responsive to an ambient light related parameter further comprises charge storage means connected to the base of the Darlington transistor and a diode connecting the base of the Darlington transistor to the current source so as to allow current flow therefrom to the base of the Darlington transistor but prevent discharge of the charge storage means except through the base of the Darlington transistor, whereby the stop sensitivity of the radio is not increased at night during short transient ambient light increases.

9. The radio receiver of claim 5 in which the solid state switch means is a transistor having a first main current carrying electrode connected to the control electrode of the solid state amplifying element, a second main current carrying electrode controlled to allow current flow therethrough only with the sweep signal and a control electrode effective to activate the current path between the first and second main current carrying electrodes only when the running light is activated.

* * * * *